United States Patent
Jung et al.

(10) Patent No.: US 12,347,654 B2
(45) Date of Patent: Jul. 1, 2025

(54) PLASMA PROCESSING APPARATUS

(71) Applicant: Tokyo Electron Limited, Tokyo (JP)

(72) Inventors: Hwajun Jung, Miyagi (JP); Masahiro Suzuki, Miyagi (JP); Yuki Hosaka, Miyagi (JP); Mitsunori Ohata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 376 days.

(21) Appl. No.: 17/338,826

(22) Filed: Jun. 4, 2021

(65) Prior Publication Data

US 2021/0384013 A1  Dec. 9, 2021

(30) Foreign Application Priority Data

Jun. 5, 2020 (JP) .................................. 2020-098432
Apr. 20, 2021 (JP) .................................. 2021-070834

(51) Int. Cl.
*H01J 37/32* (2006.01)
*H01L 21/67* (2006.01)
*H01L 21/683* (2006.01)
*H01L 21/687* (2006.01)

(52) U.S. Cl.
CPC .. *H01J 37/32642* (2013.01); *H01J 37/32715* (2013.01); *H01L 21/67069* (2013.01); *H01L 21/6831* (2013.01); *H01L 21/68721* (2013.01); *H01J 2237/1502* (2013.01); *H01J 2237/2007* (2013.01); *H01J 2237/334* (2013.01)

(58) Field of Classification Search
USPC ....................................................... 156/915
See application file for complete search history.

(56) References Cited

U.S. PATENT DOCUMENTS

| | | | | |
|---|---|---|---|---|
| 2008/0236749 | A1* | 10/2008 | Koshimizu | H01J 37/32449 156/345.33 |
| 2017/0213758 | A1* | 7/2017 | Rice | H01J 37/32082 |
| 2017/0236741 | A1* | 8/2017 | Angelov | H01J 37/00 29/559 |
| 2019/0363003 | A1* | 11/2019 | Sarode Vishwanath | H01L 21/68735 |
| 2020/0098550 | A1* | 3/2020 | Takahashi | H01L 21/6831 |

(Continued)

FOREIGN PATENT DOCUMENTS

| | | |
|---|---|---|
| JP | 2019-071369 A | 5/2019 |
| KR | 1020190130969 A | 11/2019 |

*Primary Examiner* — Ram N Kackar
(74) *Attorney, Agent, or Firm* — XSENSUS LLP

(57) ABSTRACT

A plasma processing apparatus includes a plasma processing chamber; a substrate support disposed in the plasma processing chamber and including an electrostatic chuck; a first ring disposed on the electrostatic chuck to surround a substrate on the electrostatic chuck and including an inner annular portion, an intermediate annular portion, and an outer annular portion, a top surface of the inner annular portion being higher than that of the intermediate annular portion, a top surface of the outer annular portion being higher than that of the inner annular portion; a second ring disposed on the intermediate annular portion; and an actuator configured to vertically move the second ring to maintain a top surface of the second ring at a first height greater than a height of the top surface of the inner annular portion and less than a height of the top surface of the outer annular portion.

4 Claims, 6 Drawing Sheets

(56) References Cited

U.S. PATENT DOCUMENTS

2020/0234981 A1\* 7/2020 Schmid ............... C23C 16/4401
2020/0335312 A1\* 10/2020 Kopec ................. H01L 21/6875

\* cited by examiner

PLASMA PROCESSING APPARATUS

CROSS-REFERENCE TO RELATED APPLICATION

This application claims the benefit of Japanese Patent Application Nos. 2020-098432 and 2021-070834 filed on Jun. 5, 2020 and Apr. 20, 2021, respectively, the entire disclosures of which are incorporated herein by reference.

TECHNICAL FIELD

The exemplary embodiments described herein pertain generally to a plasma processing apparatus.

BACKGROUND

A plasma processing apparatus performs a plasma processing, such as etching, on a target object, such as a semiconductor wafer (hereinafter, referred to as "wafer" or "substrate"). In the plasma processing apparatus, while the plasma processing is being performed, parts in a chamber are consumed. Such consumption of the parts affects a result of the plasma processing. For example, a focus ring, which is provided at an outer peripheral portion of the wafer for uniform plasma, is consumed and a height of a top surface thereof is lowered. As a result, a height of a plasma sheath above the wafer is different from a height of a plasma sheath above the focus ring, which affects the uniformity of the plasma processing. Therefore, there has been proposed a technique for raising the focus ring by an elevating mechanism.

Patent Document 1: Japanese Patent Laid-open Publication No. 2019-071369
Patent Document 2: Specification of U.S. Patent Application Publication No. 2017/0236741

SUMMARY

In one exemplary embodiment, a plasma processing apparatus includes a plasma processing chamber; a substrate support disposed in the plasma processing chamber, the substrate support including an electrostatic chuck; a first ring disposed on the electrostatic chuck so as to surround a substrate to be disposed on the electrostatic chuck, the first ring including an inner annular portion, an intermediate annular portion, and an outer annular portion, a top surface of the inner annular portion being higher than a top surface of the intermediate annular portion, a top surface of the outer annular portion being higher than the top surface of the inner annular portion; a second ring disposed on the top surface of the intermediate annular portion of the first ring; and an actuator configured to vertically move the second ring so as to maintain a top surface of the second ring at a first height, the first height being greater than a height of the top surface of the inner annular portion of the first ring and less than a height of the top surface of the outer annular portion of the first ring.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
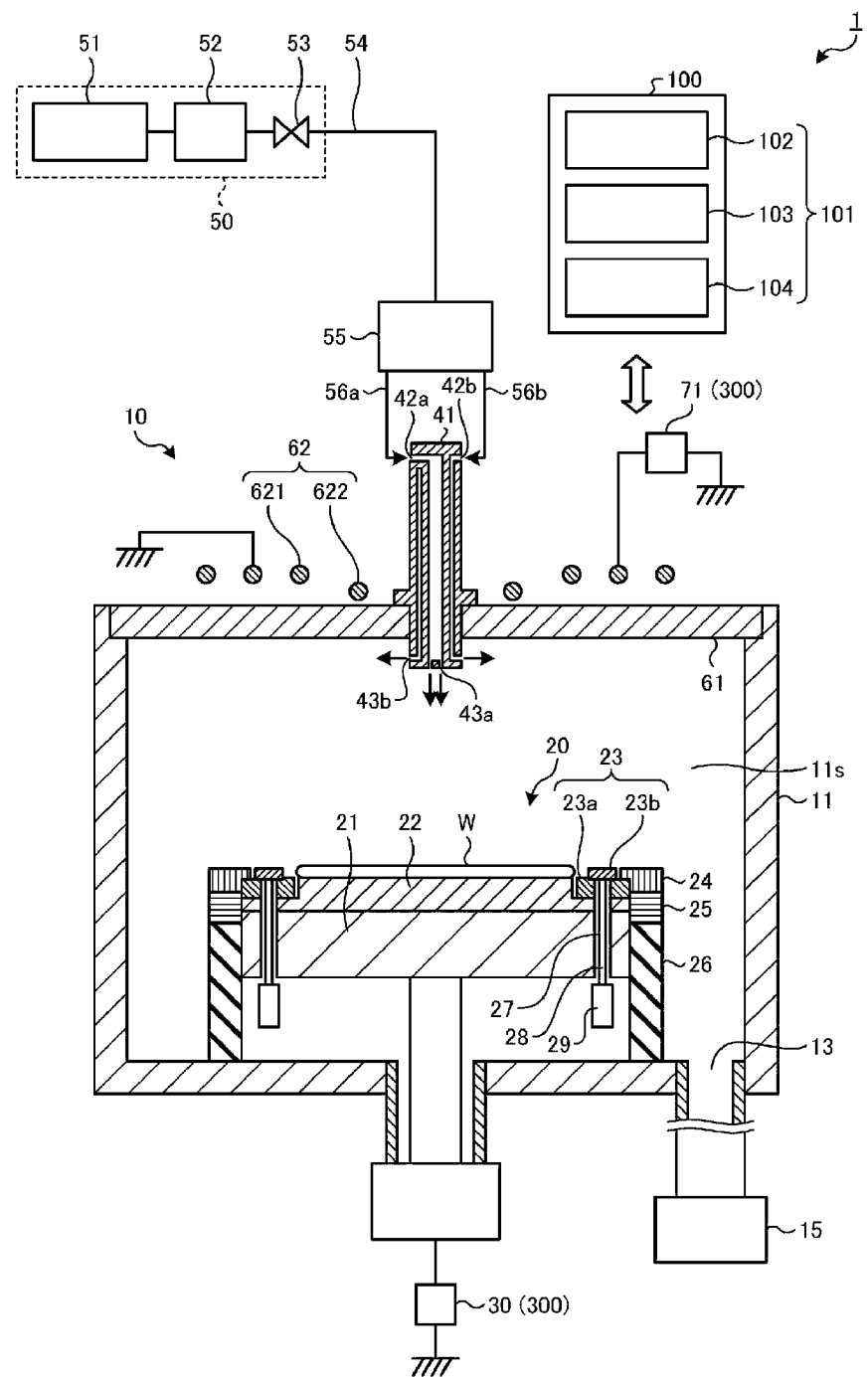
FIG. 1 illustrates an example of a plasma processing system according to a first exemplary embodiment of the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a plasma processing apparatus according to the present disclosure will be described in detail with reference to the accompanying drawings. However, the present disclosure is not limited to the following exemplary embodiments.

When a focus ring is raised by an elevating mechanism and a height of the focus ring is changed, an impedance at an end portion of a wafer is changed. Therefore, a process change, such as a change in etching rate, occurs in a central region of the wafer and an intermediate region between the central region and the end portion of the wafer. Also, when the focus ring is raised higher by 5 mm or more than the wafer in order to control tilting, an RF power ratio at the end portion of the wafer may be changed or a flow of a processing gas may be interrupted. In this case as well, the process change occurs. Accordingly, it has been expected to suppress the process change in the central region and the intermediate region of the wafer (substrate) while controlling the tilting at the end portion of the wafer.

First Exemplary Embodiment

[Configuration of Plasma Processing System 1]

FIG. 1 illustrates an example of a plasma processing system according to a first exemplary embodiment of the present disclosure. As shown in FIG. 1, a plasma processing system 1 according to the exemplary embodiment includes a plasma processing apparatus 10 and a controller 100. The plasma processing apparatus 10 is an inductively coupled plasma (ICP) processing apparatus and includes a plasma processing chamber 11, a gas supply 50, a radio frequency (RF) power supply 300 and an exhaust system 15. The plasma processing apparatus 10 also includes a substrate support 20, a gas discharging device 41 and an antenna 62. The substrate support 20 is disposed at a lower area of a plasma processing space 11s inside the plasma processing chamber 11. The gas discharging device 41 is disposed above the substrate support 20 and provided at a central opening of a dielectric window 61. The antenna 62 is disposed on or above the plasma processing chamber 11 (dielectric window 61).

The substrate support 20 is configured to support a substrate W in the plasma processing space 11s. The substrate support 20 is an example of a stage. In the exemplary embodiment, the substrate support 20 includes a lower electrode 21, an electrostatic chuck 22 and an edge ring 23. The electrostatic chuck 22 is disposed on the lower electrode 21 and configured to support the substrate W on a top surface of the electrostatic chuck 22. The lower electrode 21 serves as a bias electrode. The edge ring 23 is disposed on a top surface of a peripheral portion of the lower electrode 21 so as to surround the substrate W. Although not illustrated in the drawings, a temperature control module configured to control at least one of the electrostatic chuck 22 or the substrate W to have a target temperature may be provided in the substrate support 20 according to the exemplary embodiment. The temperature control module may include a heater, a flow path or a combination thereof. A temperature control fluid, such as a coolant or a heat transfer gas, flows in the flow path.

The edge ring 23 includes a first ring 23a and a second ring 23b. The first ring 23a has a placing portion on which the second ring 23b is placed, and an inner peripheral side than the placing portion of the first ring 23a has a greater thickness than the placing portion of the first ring 23a. That is, the first ring 23a is disposed on the electrostatic chuck 22 so as to surround the substrate W on the electrostatic chuck 22. Also, the first ring 23a includes an inner annular portion on the inner peripheral side than the placing portion; and an outer annular portion including the placing portion, and a top surface of the inner annular portion is higher than a top surface of the outer annular portion.

The second ring 23b has a smaller width than the first ring 23a and has a thickness equal to or less than a thickness of the placing portion, which is the thinnest part of the first ring 23a. The width of the second ring 23b may be set to, for example, less than 15 mm. That is, the second ring 23b is disposed on the top surface of the outer annular portion of the first ring 23a. Also, an inner diameter of the second ring 23b is greater than an inner diameter of the first ring 23a, and an outer diameter of the second ring 23b is less than an outer diameter of the first ring 23a. That is, the width of the second ring 23b is less than a width of the outer annular portion of the first ring 23a.

A cover ring 24 is disposed on an outer peripheral side of the edge ring 23. The cover ring 24 is disposed on a support 26 with an isolator 25 interposed therebetween. The cover ring 24 is disposed so as to cover a part of a top surface and a peripheral side surface of the first ring 23a and to surround the second ring 23b. Also, a top surface of the cover ring 24 is higher than the top surface of the inner annular portion of the first ring 23a. Further, the first ring 23a and the second ring 23b are made of a conductive material, such as silicon (Si) or silicon carbide (SiC), and the cover ring 24 is made of an insulating material, such as quartz ($SiO_2$).

The second ring 23b is in contact with a driving pin 28 penetrating through a hole 27 formed through the first ring 23a, the lower electrode 21 and the electrostatic chuck 22. The driving pin 28 can be vertically moved by an actuator 29 serving as a driving mechanism provided under the lower electrode 21. The driving pin 28 is made of a conductor or an insulator. The conductor may be, for example, Al, Si, SiC and $Y_2O_3$. The insulator may be, for example, quartz, alumina and ceramic. Also, the driving pin 28 and the actuator 29 are disposed at a plurality of, for example, four positions on the circumference of, for example, the second ring 23b to evenly raise the second ring 23b. That is, the second ring 23b is configured to be adjustable in distance from the first ring 23a.

In other words, the actuator 29 is configured to vertically move the second ring 23b so as to maintain a top surface of the second ring 23b at a first height. Also, in this case, the actuator 29 includes the driving pin 28. Further, the first height is greater (higher) than the height of the top surface of the inner annular portion of the first ring 23a and less (lower) than the height of the top surface of the cover ring 24.

The gas discharging device 41 is configured to supply one or more processing gases from the gas supply 50 into the plasma processing space 11s. In the exemplary embodiment, inlet openings 42a and 42b through which a processing gas is introduced into the gas discharging device 41 are provided at an upper portion of the gas discharging device 41. The inlet openings 42a and 42b are connected to lines 56a and 56b, respectively. A lower portion of the gas discharging device 41 protrudes downwards from a bottom surface of the dielectric window 61. A discharge opening 43a for discharging the processing gas downwards and a discharge opening 43b for discharging the processing gas horizontally are formed at the lower portion of the gas discharging device 41.

The gas supply 50 may include one or more gas sources 51, one or more flow rate controllers 52, valves 53, lines 54 and flow splitters (gas flow rate distributors) 55. In the exemplary embodiment, the gas supply 50 is configured to supply each of one or more processing gases from the corresponding gas source 51 to the gas discharging device 41 through the corresponding flow rate controller 52, the corresponding valve 53, the corresponding line 54, the corresponding flow splitter 55 and the corresponding line 56a or 56b. Each flow rate controller 52 may include, for example, a mass flow controller (MFC) or a pressure control type flow rate controller.

The RF power supply 300 is configured to supply a RF power, such as one or more RF signals, to the lower electrode 21 and the antenna 62. Thus, plasma is formed from the one or more processing gases supplied into the plasma processing space 11s. Therefore, the RF power supply 300 may serve as at least a part of a plasma forming device configured to form plasma from the one or more processing gases in the plasma processing chamber. In the exemplary embodiment, the RF power supply 300 includes a first RF power supply 71 and a second RF power supply 30.

The first RF power supply 71 includes a first RF generator and a first matching circuit. In the exemplary embodiment, the first RF power supply 71 is configured to supply a first RF signal from the first RF generator to the antenna 62 via the first matching circuit. In the exemplary embodiment, the first RF signal is a source RF signal having a frequency of 100 MHz or less.

The second RF power supply 30 includes a second RF generator and a second matching circuit. In the exemplary embodiment, the second RF power supply 30 is configured to supply a second RF signal from the second RF generator to the lower electrode 21 via the second matching circuit. In the exemplary embodiment, the second RF signal is a bias RF signal having a frequency of 27 MHz or less.

The antenna 62 has an outer coil 621 and an inner coil 622 coaxially disposed with respect to the gas discharging device 41. The inner coil 622 is disposed around the gas discharging device 41 so as to surround the gas discharging device 41. The outer coil 621 is disposed around the inner coil 622 so as to surround the inner coil 622. The outer coil 621 serves as a primary coil connected to the first RF power supply 71. In the exemplary embodiment, the outer coil 621 is a planar coil provided in a substantially circular spiral shape. The inner coil 622 serves as a secondary coil inductively coupled with the primary coil. That is, the inner coil 622 is not connected to the first RF power supply 71. In the exemplary embodiment, the inner coil 622 is a planar coil provided in a substantially circular ring shape. In the exemplary embodiment, the inner coil 622 is connected to a variable capacitor to control a capacitance of the variable capacitor, so that the direction and the magnitude of a current flowing in the inner coil 622 can be controlled. The outer coil 621 and the inner coil 622 may be disposed at the same height position or at different height positions. In the exemplary embodiment, the inner coil 622 is disposed at a lower position than the outer coil 621.

The exhaust system 15 may be connected to, for example, an exhaust port 13 provided at a bottom portion of the plasma processing chamber 11. The exhaust system 15 may include a pressure valve and a vacuum pump. The vacuum pump may include a turbo molecular pump, a roughing vacuum pump or a combination thereof.

In the exemplary embodiment, the controller 100 processes computer-executable instructions that cause the plasma processing apparatus 10 to perform various processes described in the present disclosure. The controller 100 may be configured to control various components of the plasma processing apparatus 10 to perform various processes described in the present disclosure. In the exemplary embodiment, a part or all of the controller 100 may be included in the plasma processing apparatus 10. The controller 100 may include, for example, a computer 101. The computer 101 may include, for example, a central processing unit (CPU) 102, a memory unit 103 and a communication interface 104. The CPU 102 may be configured to perform various control operations based on programs stored in the memory unit 103. The memory unit 103 may include a random access memory (RAM), a read only memory (ROM), a hard disk drive (HDD), a solid state drive (SSD) or a combination thereof. The communication interface 104 may communicate with the plasma processing apparatus 10 through a communication line such as a local area network (LAN).

[Impedance of Edge Ring 23]

Figure 2:
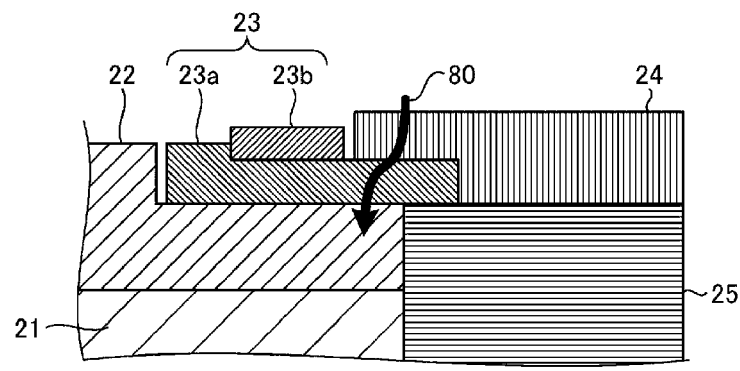
FIG. 2 is an enlarged cross-sectional view illustrating an exemplary configuration around an edge ring according to the first exemplary embodiment.
Figure 3:
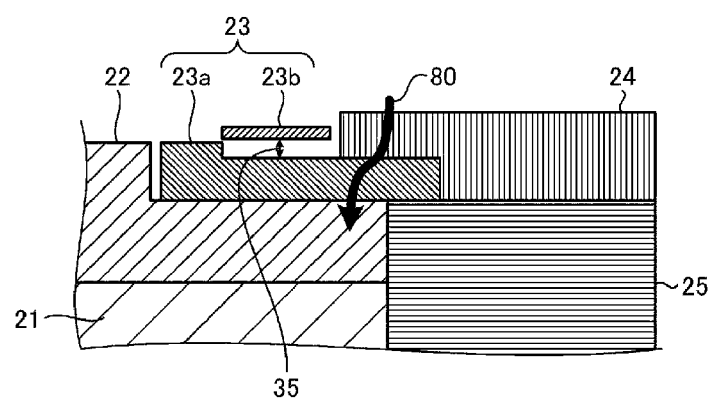
FIG. 3 is an enlarged cross-sectional view illustrating an exemplary configuration around the edge ring when a second ring is raised according to the first exemplary embodiment.

Hereinafter, an impedance of the edge ring 23 will be explained with reference to FIG. 2 to FIG. 4. FIG. 2 is an enlarged cross-sectional view illustrating an exemplary configuration around an edge ring according to the first exemplary embodiment. FIG. 3 is an enlarged cross-sectional view illustrating an exemplary configuration around the edge ring when a second ring is raised according to the first exemplary embodiment. In FIG. 2 and FIG. 3, illustration of the hole 27 and the driving pin 28 is omitted.

FIG. 2 illustrates a state where the second ring 23b of the edge ring 23 is not consumed. When the RF power from the plasma formed in the plasma processing space 11s reaches the surfaces of the second ring 23b and the cover ring 24, the RF power flows along a path 80 from the cover ring 24 side with a low impedance to the lower electrode 21 via the outer annular portion of the first ring 23a and the electrostatic chuck 22. Also, in the state shown in FIG. 2 as well, a minute air gap is present between the first ring 23a and the second ring 23b.

In a state where the second ring 23b is consumed and raised as shown in FIG. 3, the air gap between the outer annular portion of the first ring 23a and the second ring 23b is expanded to an air gap 35. In this case as well, the RF power flows along the path 80 from the cover ring 24 side with the low impedance to the lower electrode 21 via the outer annular portion of the first ring 23a and the electrostatic chuck 22. Also, the air gap 35 is less than 5 mm, and, thus, a process change is insignificant in the central region and the intermediate region of the substrate W.

Figure 4:
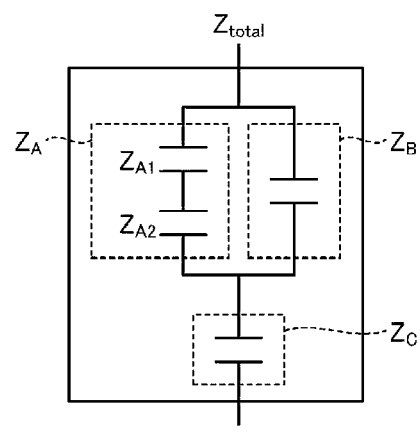
FIG. 4 illustrates an exemplary equivalent circuit around the edge ring according to the first exemplary embodiment.

FIG. 4 illustrates an exemplary equivalent circuit around the edge ring according to the first exemplary embodiment. In FIG. 4, an impedance of the second ring 23b is denoted as $Z_{A1}$, an impedance of the air gap (the minute air gap and the air gap 35) is denoted as $Z_{A2}$, and a combined impedance of $Z_{A1}$ and $Z_{A2}$ is denoted as $Z_A$. Also, an impedance of the cover ring 24 is denoted as $Z_B$ and an impedance of the first ring 23a is denoted as $Z_C$. Further, a combined impedance $Z_{total}$ around the edge ring 23 can be represented by the following equation 1.

[Equation 1]

$$Z_{total} = \frac{Z_A Z_B}{Z_A + Z_B} + Z_C = \frac{Z_A Z_B}{Z_A \left(\frac{Z_B}{Z_A} + 1\right)} + Z_C = \frac{Z_B}{\left(\frac{Z_B}{Z_A} + 1\right)} + Z_C \quad (1)$$

As shown in the equation 1, $Z_{total}$ is a combined impedance of $Z_A$, $Z_B$ and $Z_C$. $Z_A$ is increased due to the presence of the air gap. Meanwhile, $Z_B$ is set to be lower than $Z_A$, i.e., to serve as a bypass impedance that bypasses $Z_A$. For example, a thickness of the cover ring 24 is adjusted to lower an impedance for the RF power. In the equation 1, as the air gap increases, $Z_{A2}$ increases and $Z_A$ also increases, but $Z_B$ is dominant, and, thus, $Z_{total} \approx Z_B + Z_C$ is satisfied. Also, the same applies to a case where $Z_B$ is much smaller than $Z_A$. Therefore, even when the air gap is changed, the combined impedance around the edge ring 23 is changed by a small amount and remains constant. That is, in the present exemplary embodiment, even when the second ring 23b is raised, it is possible to suppress the process change in the central region and the intermediate region of the substrate W.

[Tilt Angle]

Figure 5:
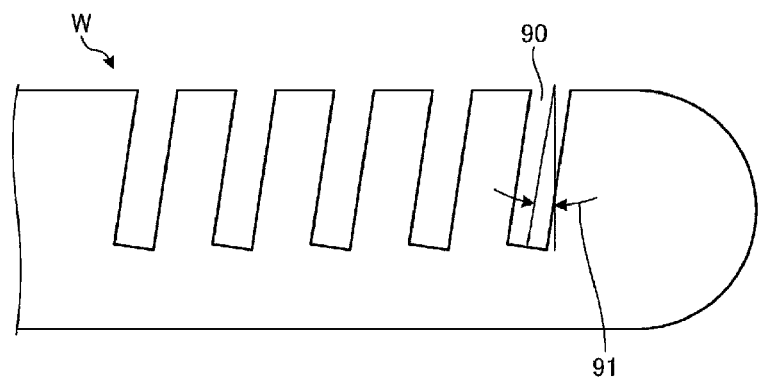
FIG. 5 illustrates an exemplary tilt angle at an end portion of a substrate.
Figure 6:
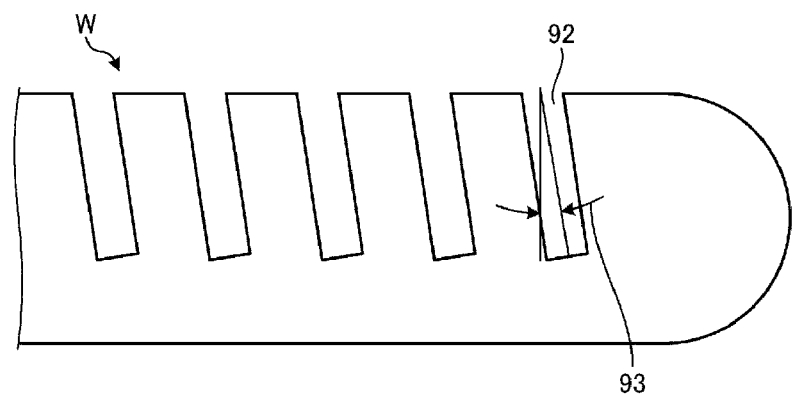
FIG. 6 illustrates an exemplary tilt angle at the end portion of the substrate.

Hereinafter, a tilt angle will be explained with reference to FIG. 5 and FIG. 6. FIG. 5 and FIG. 6 illustrate an exemplary tilt angle at the end portion of the substrate. FIG. 5 illustrates a case where the etching is performed in the state where the second ring 23b is consumed, and, thus, the plasma sheath above the second ring 23b becomes lower than the plasma sheath above the substrate W to be tilted. In this case, a hole 90 formed in the end portion of the substrate W has a tilt angle 91 in a minus direction. The tilt angle 91 is also referred to as "inside tilting".

FIG. 6 illustrates a case where the etching is performed in the state where the second ring 23b is raised, and, thus, the plasma sheath above the second ring 23b becomes higher than the plasma sheath above the substrate W to be tilted. In this case, a hole 92 formed in the end portion of the substrate W has a tilt angle 93 in a plus direction. The tilt angle 93 is also referred to as "outside tilting". That is, in the present exemplary embodiment, it is possible to control the tilting at the end portion of the substrate W by raising the second ring 23b and adjusting the distance between the first ring 23a and the second ring 23b.

Second Exemplary Embodiment

In the first exemplary embodiment, a thickness of the first ring 23a in the path 80 for the RF power is equal to a thickness of the placing portion on which the second ring 23b is placed, i.e., a thickness of the thinnest portion of the first ring 23a. However, the thickness of the first ring 23a in the path 80 for the RF power may be greater than that of the placing portion. This will be described below as a second exemplary embodiment.

Figure 7:
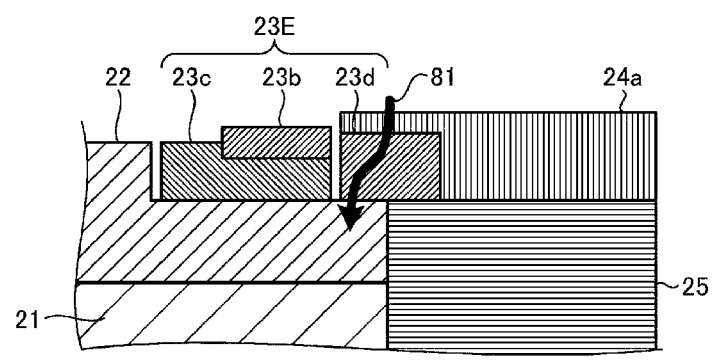
FIG. 7 is an enlarged cross-sectional view illustrating an exemplary configuration around an edge ring according to a second exemplary embodiment.

FIG. 7 is an enlarged cross-sectional view illustrating an exemplary configuration around an edge ring according to the second exemplary embodiment. An edge ring 23E shown in FIG. 7 includes a first ring 23c, instead of the first ring 23a, and a third ring 23d, as compared with the edge ring 23 of the first exemplary embodiment. Also, the substrate support 20 of the second exemplary embodiment includes a cover ring 24a instead of the cover ring 24 of the first exemplary embodiment. In FIG. 7, the illustration of the hole 27 and the driving pin 28 is omitted.

The first ring 23c has a smaller radial width than the first ring 23a, and an end portion on an outer peripheral side of the first ring 23c is located at substantially the same position as an end portion on an outer peripheral side of the second ring 23b. That is, the first ring 23c is disposed on the electrostatic chuck 22 so as to surround the substrate W on the electrostatic chuck 22. Also, the first ring 23c includes an inner annular portion on an inner peripheral side than the placing portion and an outer annular portion including the placing portion, and a top surface of the inner annular portion is higher than a top surface of the outer annular portion. The second ring 23b is disposed on the top surface of the outer annular portion of the first ring 23c. Also, the width of the second ring 23b is equal to a width of the outer annular portion of the first ring 23c.

The third ring 23d is disposed on a further outer peripheral side so as to surround the first ring 23c and the second ring 23b. That is, the third ring 23d is disposed so as to surround the first ring 23c and the second ring 23b. The third ring 23d is a member of the first ring 23a which is covered with the cover ring 24 and separated from the first ring 23c and has a greater thickness than the placing portion of the first ring 23a. That is, the first ring 23c and the third ring 23d are separated by a gap therebetween. Also, the third ring 23d partly extends above the electrostatic chuck 22.

Further, the cover ring 24a has a portion covering the third ring 23d with a small thickness depending on a thickness of the third ring 23d, as compared with the cover ring 24. That is, the cover ring 24a is disposed so as to cover a top surface and a peripheral side surface of the third ring 23d. Also, a top surface of the cover ring 24a is higher than the top surface of the inner annular portion of the first ring 23c.

The first ring 23c is made of a conductive material, such as silicon (Si) or silicon carbide (SiC), similar to the first ring 23a. Further, the third ring 23d may be made of a conductive material, such as silicon (Si) or silicon carbide (SiC), or may be made of a conductive ceramic having a higher electrical conductivity. That is, the third ring 23d may be made of a material having an electrical conductivity that is higher than an electrical conductivity of the first ring 23c and an electrical conductivity of the second ring 23b. Also, the cover ring 24a is made of an insulating material, such as quartz ($SiO_2$), similar to the cover ring 24.

Moreover, the actuator 29 is configured to vertically move the second ring 23b so as to maintain the top surface of the second ring 23b at the first height as in the first exemplary embodiment. Further, in this case, the actuator 29 includes the driving pin 28. Furthermore, the first height is greater (higher) than the height of the top surface of the inner annular portion of the first ring 23c and less (lower) than the height of the top surface of the cover ring 24a.

In FIG. 7, when the RF power from the plasma formed in the plasma processing space 11s reaches the surfaces of the second ring 23b and the cover ring 24a, the RF power flows along a path 81 from the cover ring 24a side with a low impedance to the lower electrode 21 via the third ring 23d and the electrostatic chuck 22. That is, a combined impedance of the cover ring 24a and a difference in thickness between the third ring 23d and the first ring 23a corresponds to $Z_B$ shown in FIG. 4. Also, even in the state where the second ring 23b is raised, the RF power flows along the path 81 from the cover ring 24a side with the low impedance to the lower electrode 21 via the third ring 23d and the electrostatic chuck 22. As described above, even when the edge ring 23E is used, it is possible to suppress the process change in the central region and the intermediate region of the substrate W while controlling the tiling at the end portion of the substrate W as in the first exemplary embodiment.

Third Exemplary Embodiment

In the second exemplary embodiment, the third ring 23d is separated from the first ring 23c in the path 81 for the RF power. However, the third ring 23d and the first ring 23c may be integrated as one body. This will be described below as a third exemplary embodiment.

Figure 8:
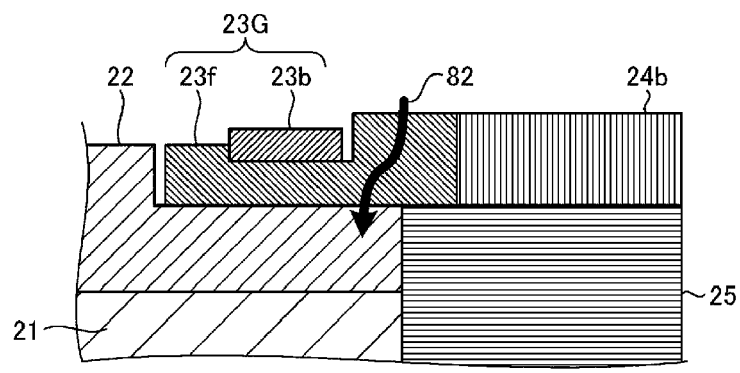
FIG. 8 is an enlarged cross-sectional view illustrating an exemplary configuration around an edge ring according to a third exemplary embodiment.

FIG. 8 is an enlarged cross-sectional view illustrating an exemplary configuration around an edge ring according to the third exemplary embodiment. An edge ring 23G shown in FIG. 8 includes a first ring 23f, instead of the first ring 23c and the third ring 23d, as compared with the edge ring 23E of the second exemplary embodiment. Also, the substrate support 20 of the third exemplary embodiment includes a cover ring 24b instead of the cover ring 24a of the second exemplary embodiment. In FIG. 8, the illustration of the hole 27 and the driving pin 28 is omitted.

The first ring 23f is a member formed by providing the first ring 23c and the third ring 23d as one body and has a greater thickness at an outer peripheral side than at the placing portion. In the first ring 23f, the outer peripheral side of the placing portion has a greater thickness than an inner peripheral side of the placing portion. That is, the first ring 23f is disposed on the electrostatic chuck 22 so as to surround the substrate W on the electrostatic chuck 22. Also, the first ring 23f includes an inner annular portion on an inner peripheral side than the placing portion, an intermediate annular portion as the placing portion and an outer annular portion on the outer peripheral side than the placing portion. Here, in the first ring 23f, a top surface of the inner annular portion is higher than a top surface of the intermediate annular portion, and a top surface of the outer annular portion is higher than the top surface of the inner annular portion. The second ring 23b is disposed on the top surface of the intermediate annular portion of the first ring 23f. A width of the second ring 23b is equal to or less than a width of the intermediate annular portion of the first ring 23f.

The cover ring 24b is disposed so as to surround the first ring 23f. The cover ring 24b does not have a portion covering the outer annular portion of the first ring 23f, as compared with the cover ring 24a. The first ring 23f is made of a conductive material, such as silicon (Si) or silicon carbide (SiC), similar to the first ring 23c. The cover ring 24b is made of an insulating material, such as quartz ($SiO_2$), similar to the cover ring 24.

Moreover, the actuator 29 is configured to vertically move the second ring 23b so as to maintain the top surface of the second ring 23b at the first height as in the first exemplary embodiment. Further, in this case, the actuator 29 includes the driving pin 28. Furthermore, the first height is greater (higher) than the height of the top surface of the inner annular portion of the first ring 23f and less (lower) than the height of the top surface of the outer annular portion of the first ring 23f.

In FIG. 8, when the RF power from the plasma formed in the plasma processing space 11s reaches the surfaces of the second ring 23b, the first ring 23f and the cover ring 24b, the RF power flows along a path 82 from the outer annular portion of the first ring 23f with a low impedance to the lower electrode 21 via the electrostatic chuck 22. That is, an impedance of a difference in thickness between the outer annular portion of the first ring 23f and the first ring 23a corresponds to $Z_B$ shown in FIG. 4. Also, even in the state where the second ring 23b is raised, the RF power flows along the path 82 from the outer annular portion of the first ring 23f with the low impedance to the lower electrode 21 via the electrostatic chuck 22. As described above, even when the edge ring 23G is used, it is possible to suppress the process change in the central region and the intermediate region of the substrate W while controlling the tiling at the end portion of the substrate W as in the first and second exemplary embodiments.

[Test Result]

Figure 9:
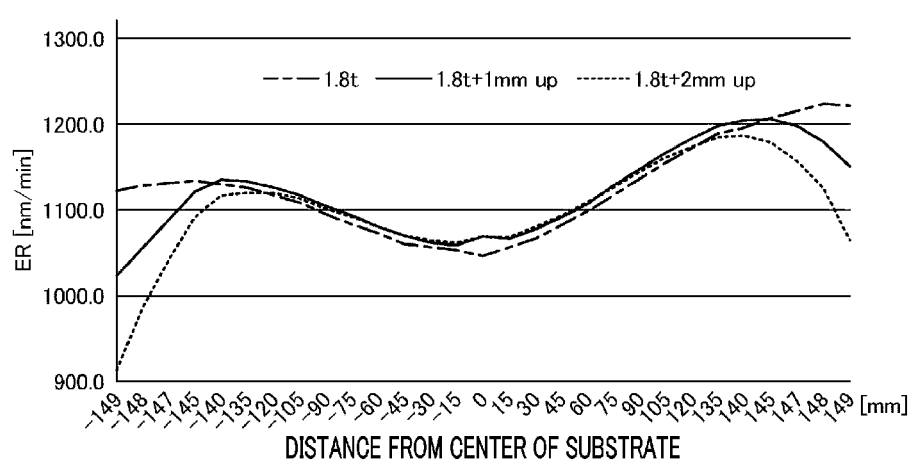
FIG. 9 shows an exemplary test result according to the third exemplary embodiment.
Figure 10:
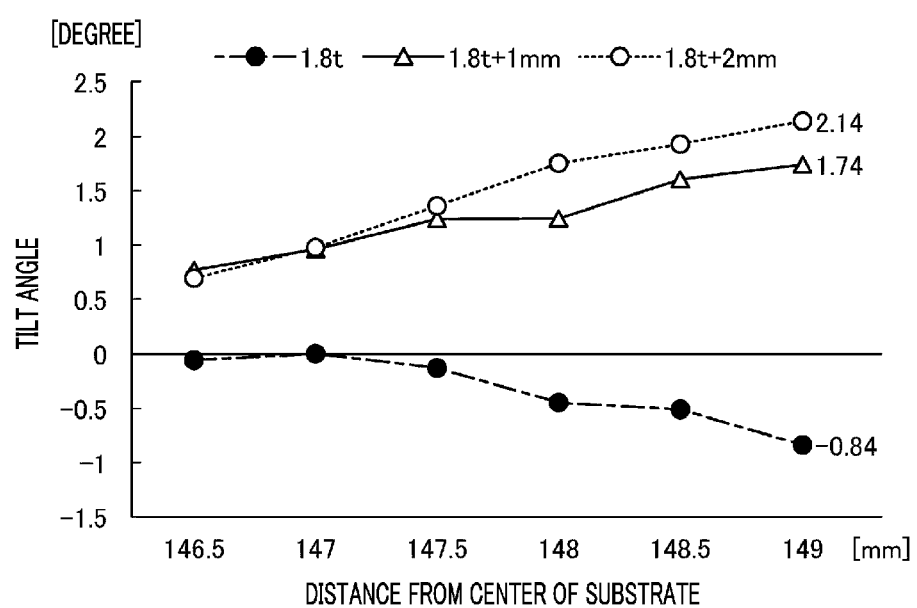
FIG. 10 shows an exemplary test result according to the third exemplary embodiment.

Hereinafter, test results according to the third exemplary embodiment will be explained with reference to FIG. 9 and FIG. 10. FIG. 9 and FIG. 10 show exemplary test results according to the third exemplary embodiment. In FIG. 9 and FIG. 10, a radial width of the first ring 23f is 14 mm, a thickness of the placing portion (intermediate annular portion) is 2.2 mm, and a thickness of the outer annular portion of the first ring 23f is 4.4 mm. Also, a radial width of the second ring 23b is 7 mm and a thickness of the second ring 23b is 1.8 mm (1.8t).

Further, FIG. 9 and FIG. 10 compare a case where the second ring 23b is not raised (1.8t in FIG. 9 and FIG. 10), a case where the second ring 23b, which is not consumed, is raised by 1 mm (1.8 t+1 mm up in FIG. 9 and FIG. 10), and a case where the second ring 23b is raised by 2 mm (1.8 t+2 mm up in FIG. 9 and FIG. 10). Also, the substrate W is a 300 mm wafer.

FIG. 9 shows a radial distribution of an etching rate when the substrate W is etched. As shown in FIG. 9, when the second ring 23b is raised by 1 mm and 2 mm, the etching rate is greatly changed at the end portion of the substrate W, as compared with the case where the second ring 23b is not raised. Meanwhile, the etching rate is changed by about 0.5% in the central region and the intermediate region of the substrate W (diameter of 280 mm). Accordingly, it can be seen that even when the second ring 23b is raised, the process change in the central region and the intermediate region of the substrate W is suppressed. Also, at the end portion of the substrate W, the etching rate in the case where the second ring 23b is consumed and raised is close to the etching rate in the case where the second ring 23b is not consumed.

FIG. 10 shows the tilt angle at the end portion of the substrate W. As shown in FIG. 10, when the second ring 23b is not raised, the tilt angle is directed to the minus direction, and when the second ring 23b is raised by 1 mm and 2 mm, the tilt angle is directed to the plus direction. Also, when the second ring 23b is raised by 2 mm, the tilt angle increases in the plus direction, as compared with the case where the second ring 23b is raised by 1 mm. Accordingly, it is possible to control the tilting at the end portion of the substrate W depending on the raising amount of the second ring 23b.

According to the third exemplary embodiment, the plasma processing apparatus 10 includes the plasma processing chamber 11; the substrate support 20 which is disposed in the plasma processing chamber 11 and which includes the electrostatic chuck 22; and the first ring 23f which is disposed on the electrostatic chuck 22 so as to surround the substrate W on the electrostatic chuck 22 and which includes the inner annular portion, the intermediate annular portion and the outer annular portion. The top surface of the inner annular portion is higher than the top surface of the intermediate annular portion and the top surface of the outer annular portion is higher than the top surface of the inner annular portion. The plasma processing apparatus 10 further includes the second ring 23b disposed on the intermediate annular portion of the first ring 23f, and the actuator 29 configured to vertically move the second ring 23b so as to maintain the top surface of the second ring 23b at a first height. The first height is greater than a height of the top surface of the inner annular portion of the first ring 23f and less than a height of the top surface of the outer annular portion of the first ring 23f. As a result, it is possible to suppress the process change in the central region and the intermediate region of the substrate W while controlling the tilting at the end portion of the substrate W. Also, the change of the combined impedance around the edge ring 23G can be reduced.

According to the third exemplary embodiment, a width of the second ring 23b is equal to or smaller than a width of the intermediate annular portion of the first ring 23f. As a result, it is possible to suppress the process change in the central region and the intermediate region of the substrate W while controlling the tilting at the end portion of the substrate W. Also, the change of the combined impedance around the edge ring 23G can be reduced.

According to the third exemplary embodiment, the first ring 23f and the second ring 23b are made of silicon or silicon carbide. As a result, the change of the combined impedance around the edge ring 23G can be reduced.

According to the third exemplary embodiment, the plasma processing apparatus 10 further includes the cover ring 24b disposed so as to surround the first ring 23f and made of an insulating material. As a result, the change of the combined impedance around the edge ring 23G can be reduced.

According to the second exemplary embodiment, the plasma processing apparatus 10 includes the plasma processing chamber 11, the substrate support 20 disposed in the plasma processing chamber 11 and including the electrostatic chuck 22, and the first ring 23c disposed on the electrostatic chuck 22 so as to surround the substrate W on the electrostatic chuck 22, made of a conductive material and including the inner annular portion and the outer annular portion. The top surface of the inner annular portion is higher than the top surface of the outer annular portion. The plasma processing apparatus 10 also includes the second ring 23b disposed on the top surface of the outer annular portion of the first ring 23c and made of a conductive material, the third ring 23d disposed so as to surround the first ring 23c and the second ring 23b and made of a conductive material, and the cover ring 24a disposed so as to cover the top surface and the peripheral side surface of the third ring 23d and made of an insulating material. The top surface of the cover ring 24a is higher than the top surface of the inner annular portion of the first ring 23c. The plasma processing apparatus 10 further includes the actuator 29 configured to vertically move the second ring 23b so as to maintain the top surface of the second ring 23b at a first height. The first height is greater than a height of the top surface of the inner annular portion of the first ring 23c and less than a height of the top surface of the cover ring 24a. As a result, it is possible to suppress the process change in the central region and the intermediate region of the substrate W while controlling the tilting at the end portion of the substrate W. Also, the change of the combined impedance around the edge ring 23E can be reduced.

According to the second exemplary embodiment, the third ring 23d is made of a material having an electrical conductivity that is higher than an electrical conductivity of the first ring 23c and an electrical conductivity of the second ring 23b. As a result, the change of the combined impedance around the edge ring 23E can be reduced.

According to the second exemplary embodiment, the first ring 23c and the third ring 23d are separated by a gap therebetween. As a result, it is possible to allow more RF power to flow from the third ring 23d side to the lower electrode 21.

According to the second exemplary embodiment, the third ring 23d partly extends above the electrostatic chuck 22. As a result, the change of the combined impedance around the edge ring 23E can be reduced.

According to the second exemplary embodiment, a width of the second ring 23b is the same as a width of the outer annular portion of the first ring 23c. As a result, it is possible to suppress the process change in the central region and the intermediate region of the substrate W while controlling the tilting at the end portion of the substrate W.

According to the second exemplary embodiment, the first ring 23c, the second ring 23b and the third ring 23d are made of silicon or silicon carbide. As a result, the change of the combined impedance around the edge ring 23E can be reduced.

According to the first exemplary embodiment, the plasma processing apparatus 10 includes the plasma processing chamber 11; the substrate support 20 which is disposed in the plasma processing chamber 11 and which includes the electrostatic chuck 22; and the first ring 23a which is disposed on the electrostatic chuck 22 so as to surround the substrate W on the electrostatic chuck 22, made of a conductive material and which includes the inner annular portion and the outer annular portion. The top surface of the inner annular portion is higher than the top surface of the outer annular portion. The plasma processing apparatus 10 also includes the second ring 23b disposed on the top surface of the outer annular portion of the first ring 23a and made of a conductive material. An inner diameter of the second ring 23b is greater than an inner diameter of the first ring 23a, and an outer diameter of the second ring 23b is less than an outer diameter of the first ring 23a. The plasma processing apparatus 10 further includes the cover ring 24 disposed so as to cover a part of the top surface and the peripheral side surface of the first ring 23a and to surround the second ring 23b and made of an insulating material. The top surface of the cover ring 24 is higher than the top surface of the inner annular portion of the first ring 23a. The plasma processing apparatus 10 also includes the actuator 29 configured to vertically move the second ring 23b so as to maintain the top surface of the second ring 23b at the first height. The first height is greater than the height of the top surface of the inner annular portion of the first ring 23a and less than the height of the top surface of the cover ring 24. As a result, it is possible to suppress the process change in the central region and the intermediate region of the substrate W while controlling the tilting at the end portion of the substrate W.

According to the first exemplary embodiment, a width of the second ring 23b is less than a width of the outer annular portion of the first ring 23a. As a result, the change of the combined impedance around the edge ring 23 can be reduced.

According to the first exemplary embodiment, the first ring 23a and the second ring 23b are made of silicon or silicon carbide. As a result, the change of the combined impedance around the edge ring 23 can be reduced.

While various exemplary embodiments have been described above, various omissions, substitutions, and changes may be made without being limited to the above-described exemplary embodiments. Further, other exemplary embodiments can be implemented by combining elements in different exemplary embodiments.

Also, in each of the above-described exemplary embodiments, the plasma processing apparatus 10 for performing etching or the like on the substrate W using inductively-coupled plasma as a plasma source has been described as an example. However, the present disclosure is not limited thereto. As long as an apparatus performs a processing on the substrate W using plasma, the plasma source is not limited to the inductively-coupled plasma. For example, the plasma source may be any plasma source such as capacitively-coupled plasma, microwave plasma, magnetron plasma or the like.

According to the present disclosure, it is possible to suppress a process change in a central region and an intermediate region of a substrate while controlling tilting at an end portion of the substrate.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:
1. A plasma processing apparatus comprising:
a plasma processing chamber;

a substrate support disposed in the plasma processing chamber, the substrate support including an electrostatic chuck;

a first ring disposed on the electrostatic chuck so as to surround a substrate to be disposed on the electrostatic chuck, the first ring including an inner annular portion, an intermediate annular portion, and an outer annular portion, a top surface of the inner annular portion being higher than a top surface of the intermediate annular portion, a top surface of the outer annular portion being higher than the top surface of the inner annular portion;

a second ring disposed on the top surface of the intermediate annular portion of the first ring and having a thickness equal to or less than the intermediate annular portion, wherein a top surface of the second ring is positioned at a first height and the first height is greater than a height of the top surface of the inner annular portion of the first ring and is less than a height of the top surface of the outer annular portion of the first ring; and an actuator configured to vertically move the second ring so as to maintain the top surface of the second ring at the first height.

2. The plasma processing apparatus set forth in claim 1, wherein a width of the second ring is equal to or less than a width of the intermediate annular portion of the first ring.

3. The plasma processing apparatus set forth in claim 1, wherein the first ring and the second ring comprise silicon or silicon carbide.

4. The plasma processing apparatus set forth in claim 3, further comprising:

a cover ring disposed so as to surround the first ring, the cover ring being composed of an insulating material.

* * * * *